United States Patent [19]

Bramnik

[11] Patent Number: 5,668,766
[45] Date of Patent: Sep. 16, 1997

[54] METHOD AND APPARATUS FOR INCREASING MEMORY READ ACCESS SPEED USING DOUBLE-SENSING

[75] Inventor: Arkady Bramnik, Kizijat Motzkin, Israel

[73] Assignee: Intel Corporation, Santa Clara, Calif.

[21] Appl. No.: 648,684

[22] Filed: May 16, 1996

[51] Int. Cl.$^6$ .................................................. G11C 7/02
[52] U.S. Cl. ........................... 365/207; 365/49; 365/205; 365/208
[58] Field of Search .................................. 365/207, 205, 365/208, 194, 49

[56] References Cited

U.S. PATENT DOCUMENTS

| | | | |
|---|---|---|---|
| 4,926,387 | 5/1990 | Madland | 365/233 |
| 5,018,111 | 5/1991 | Madland | 365/233 |
| 5,031,141 | 7/1991 | Guddat et al. | 365/49 |
| 5,274,598 | 12/1993 | Fujii et al. | 365/205 |
| 5,291,452 | 3/1994 | Hotta | 365/208 |
| 5,307,317 | 4/1994 | Shiraishi et al. | 365/205 |
| 5,422,781 | 6/1995 | DiMarco | 365/226 |
| 5,455,802 | 10/1995 | McClure | 365/233 |

*Primary Examiner*—David C. Nelms
*Assistant Examiner*—Hien Nguyen
*Attorney, Agent, or Firm*—Blakely, Sokoloff, Taylor & Zafman

[57] ABSTRACT

Double-sensing of a data store being read to increase overall memory read access speed. An indicator signal coupled to the data store being read is responsive to a value stored in the data store. A first sense amplifier has a first input coupled to the indicator signal, a second input coupled to receive a first sense enable signal at a first sense time and an output coupled to provide a first indicated data value responsive to the first sense enable signal and the indicator signal. A second sense amplifier has a first input coupled to the indicator signal, a second input coupled to receive a second sense enable signal at a second sense time, and an output coupled to provide a second indicated data value responsive to the second sense enable signal and the indicator signal.

In one embodiment, a first input of a comparator is coupled to the output of the first sense amplifier and a second input of the comparator is coupled to the output of the second sense amplifier. An output of the comparator is coupled to a signal which invalidates the first indicated value if the first indicated value sensed at the first sense time is different than the second indicated value sensed at the second sense time.

10 Claims, 5 Drawing Sheets

METHOD AND APPARATUS FOR INCREASING MEMORY READ ACCESS SPEED USING DOUBLE-SENSING

BACKGROUND OF THE INVENTION

1. Field of the Invention

The invention relates to the field of memory technologies, and in particular, to double-sensing of a memory cell being read to improve overall memory read access speed.

2. Description of Related Art

Figure 1:
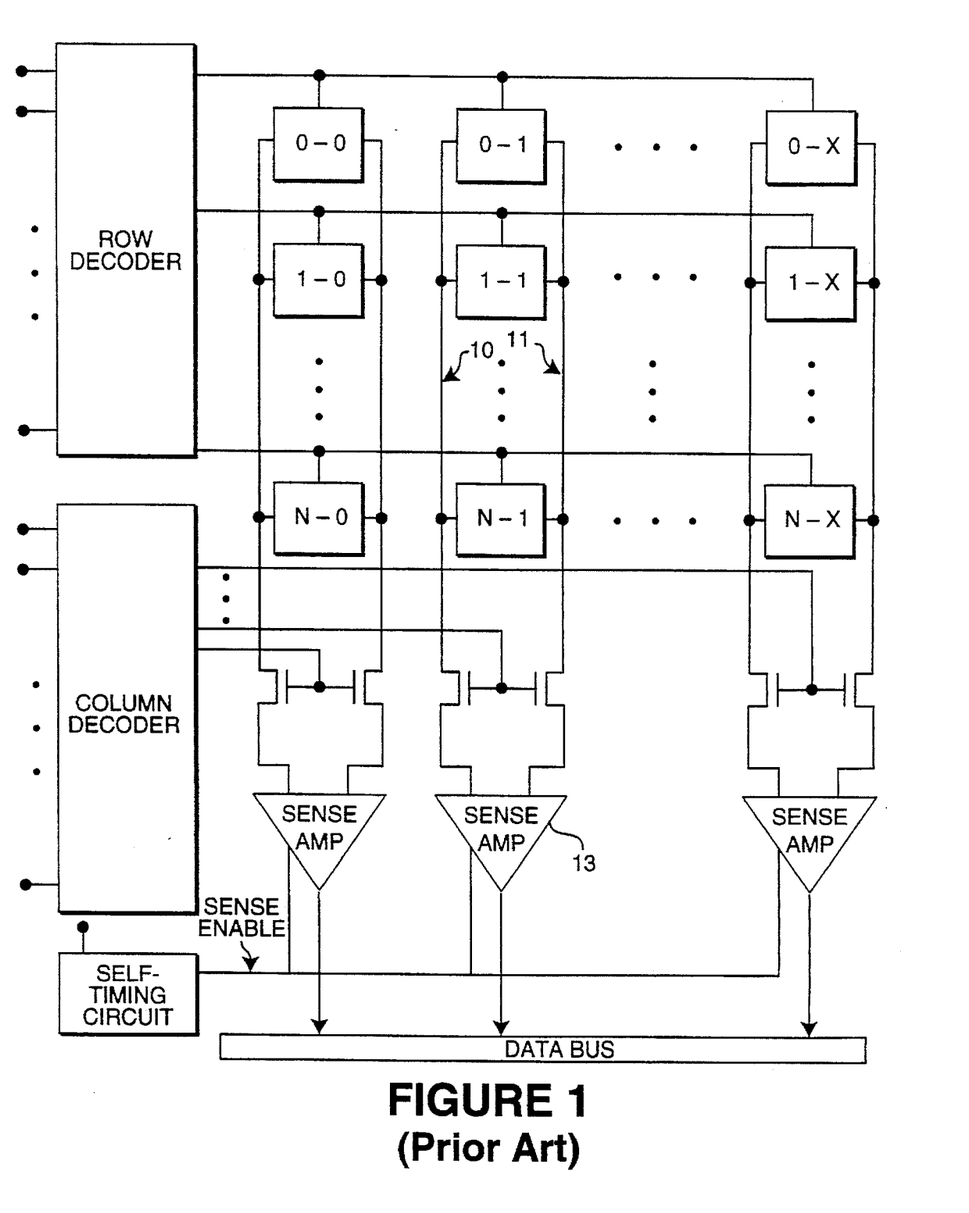
FIG. 1 illustrates a prior art memory using differential sensing to detect the contents of the memory.

In a computer system including a high-speed microprocessor, the access speed of the cache memory is critical in determining the cycle time of the computer system, and can be a limiting factor preventing a microprocessor from realizing its full performance potential. One factor determining the access speed of a particular memory device is the scheme used to detect the contents of the memory. Differential sensing is one well-known approach. FIG. 1 illustrates an example of a differential sensing scheme used to read the contents of an MOS RAM array. As shown, each memory cell in the array, such as memory cell 1-1 provides its output on two complementary bit lines such as bit lines 10 and 11 for memory cell 1-1. Differential sensing operates by sensing a differential signal between the two complementary differential output bit lines coupled to a particular memory cell with a sensing device such as the sense amplifier 13. The differential signal is then decoded by the sense amplifier to determine the value stored in the memory cell.

High precision sense amplifiers are now available which can sense very small differences (100–200 mV) between the complementary output bit lines. However, unpredictable effects on the bit line pairs, such as voltage drop and alpha particle effects, may operate to reduce the differential sensing speed, and thus, increase the memory access speed, by increasing the time necessary to generate a detectable differential signal.

As mentioned, the above detrimental effects on the bit line pairs are unpredictable. Further, the access time push-out caused by these effects tends to be somewhat data pattern-sensitive. To guard against data integrity issues which might be caused by sensing the differential signal too early, existing memories are limited to an access time which takes into account the worst case combination of effects on the development of the differential signal. In other words, the sense amplifier is only enabled after a delay calculated to ensure, even in the presence of voltage drop, alpha particle and/or other effects, that the required minimum differential has developed between the bit line signals. The self-timing circuit 14 of FIG. 1, for example, imposes this delay regardless of whether a particular sensing operation is affected in this manner or not.

Thus, it is desirable to be able to speed up memory access by avoiding the delay imposed to account for detrimental effects on the sensed signal when a particular sensing operation is not affected. It is further desirable to be able to do so without compromising data integrity or robustness.

SUMMARY OF THE INVENTION

A method and apparatus for increasing overall memory read access speed by double-sensing of a data store being read is described. An indicator signal responsive to a value stored in the data store is coupled to the data store. A first sense amplifier has a first input coupled to the indicator signal, a second input coupled to receive a first sense enable signal at a first sense time and an output coupled to provide a first indicated data value responsive to the first sense enable signal and the indicator signal. A second sense amplifier has a first input coupled to the indicator signal, a second input coupled to receive a second sense enable signal at a second sense time, and an output coupled to provide a second indicated data value responsive to the second sense enable signal and the indicator signal.

In one embodiment, the output of the first sense amplifier is coupled to a first input of a comparator and the output of the second sense amplifier is coupled to a second input of the comparator. An output of the comparator is coupled to a signal which invalidates the first indicated value if the first indicated value is different than the second indicated value.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

DETAILED DESCRIPTION OF THE INVENTION

A method and apparatus for increasing overall memory read access speed by double-sensing a memory cell being read is described. In the following description, numerous details such as specific signals, circuit arrangements, and memory organizations, are set forth in order to provide a thorough understanding of the invention. However, it will be appreciated by one of ordinary skill in the art that these specific details are not required in order to practice the invention. In other instances, well-known circuits and structures are shown in block diagram form in order to avoid obscuring the invention.

Overview of One Embodiment of the Invention

One embodiment of the invention improves overall memory read access performance by sensing the differential indicator signal twice: once at a first sensing point after a first delay from receipt of a read access signal, and again at a second sensing point after a second, longer delay from receipt of the read access signal without having to reaccess the memory cell. This operation is referred to alternately herein as double-sensing or double-latching.

Computer System in Accordance with One Embodiment of the Invention

Figure 2:
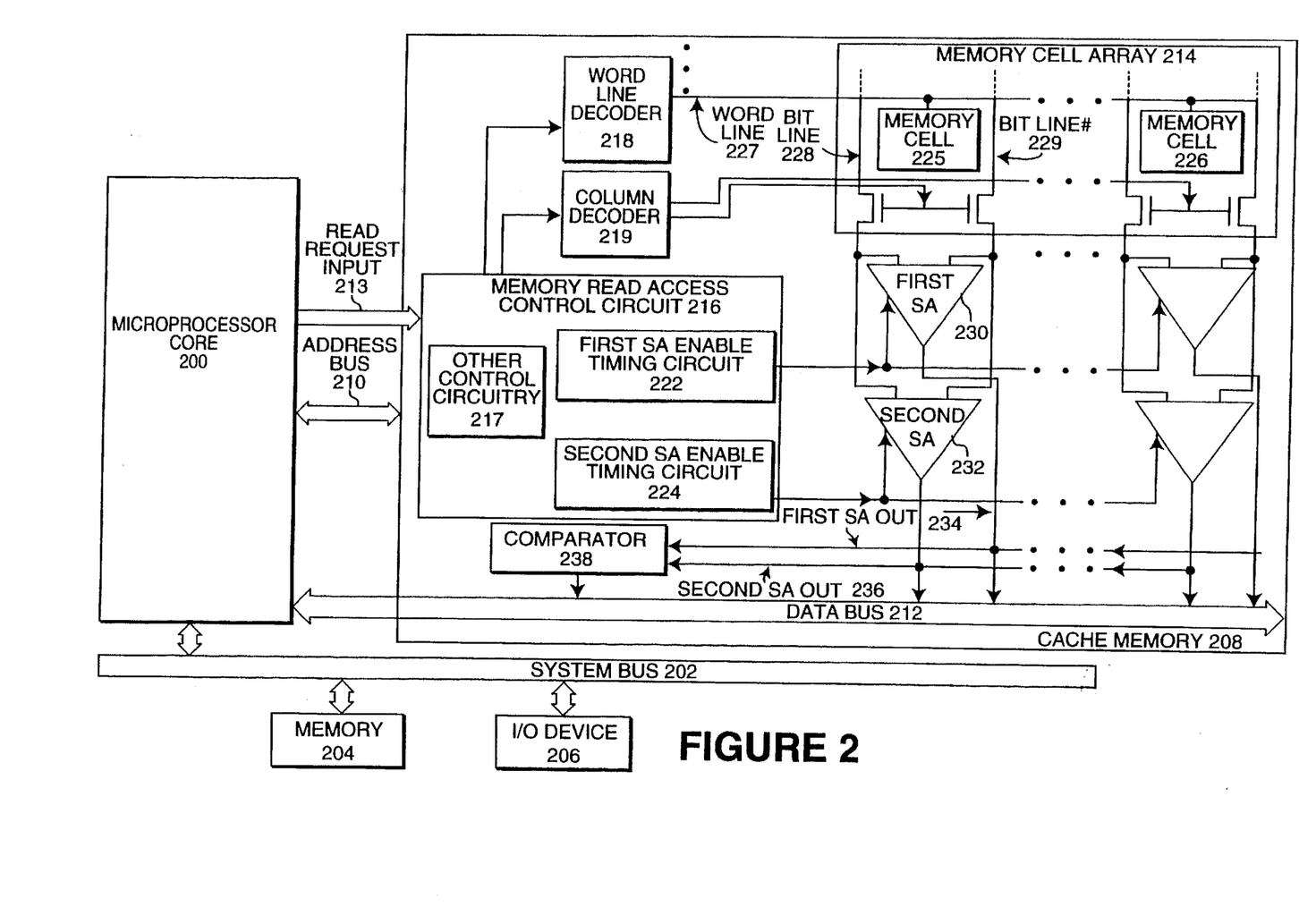
FIG. 2 is a block diagram illustrating a computer system in accordance with one embodiment of the invention including a memory utilizing the double-sensing method and apparatus of one embodiment of the invention.

Referring to FIG. 2, a computer system in accordance with one embodiment of the invention is illustrated. The computer system of FIG. 2 includes a microprocessor 200 for processing information. The microprocessor 200 is coupled to a system bus 202 such that the microprocessor 200 can communicate with other computer system components. In one embodiment, the microprocessor 200 is an Intel Architecture microprocessor such as is manufactured by Intel Corporation of Santa Clara, Calif., however, other processor architectures may also be used in accordance with the invention. A memory 204 such as a random access memory (RAM), also referred to as system memory or main memory, is coupled to the bus 202 for storing information and instructions for the microprocessor 200, and an input/output (I/O) device 206 such as a keyboard or printer, is also coupled to the bus 202.

In the embodiment illustrated in FIG. 2, the microprocessor 200 is a microprocessor core which is coupled to an on-board first-level cache memory 208. In alternate embodiments, the microprocessor 200 is a standalone microprocessor and the cache memory 208 is a second-level cache memory which may be a separate integrated circuit component from the microprocessor 200, or may be encapsulated within the same integrated circuit device package. The microprocessor core 200 and cache memory 208 are coupled together by an address bus 210, a data bus 212 and a read request input 213.

It will be appreciated by those of ordinary skill in the art that other computer systems including additional components not illustrated in FIG. 2, or configured without components that are illustrated in FIG. 2 may also be used to practice the invention. It will also be appreciated that, although the invention is described herein with reference to a cache memory, other types of data storage devices, such as flash memory, other types of static random access memory (SRAM), and dynamic random access memory (DRAM) may also benefit from and be utilized in accordance with the invention. The invention is particularly advantageous for use in applications where memory read accesses are performed in the "critical path." A memory read access is considered to be in the critical path of processing if the memory read access is a factor in determining the microprocessor cycle time. In this case, minimizing overall memory read access speed is critical to maximizing performance.

With continuing reference to FIG. 2, the cache memory 208 includes a memory array 214. It should be noted that, within the cache memory 208, only a single memory cell array 214 is illustrated, however, multiple banks or arrays of memory may be incorporated in the cache memory 208 as is well-known in the art. Also, the term "data store" is used herein to refer to generally to a storage element, a memory cell being one type of storage element.

The cache memory 208 of the invention also includes a memory read access control circuit 216 coupled to the address bus 210. The memory read access control circuit 216 operates to respond to read access requests directed to the cache memory 208 received from the microprocessor 200 or other internal or external source. Such memory read requests are received by the memory read access control circuit on the read request input 213 and address bus 210. The memory read access; control circuit 216 of one embodiment also operates to determine the order in which data should be read back to the microprocessor 200 or other component over the data bus 212.

The memory read access control circuit 216 of one embodiment includes control circuitry 217 for performing various memory read access control functions, and two sense enable timing circuits 222 and 224, the functions and operation of which are described in more detail below. The memory read access control circuit 216 is coupled to a word line decoder 218, also referred to as a row decoder, which asserts the appropriate word line in the cache memory 208 in response to a read request to activate the memory row being read. A column decoder 219 is also coupled to the memory read access control circuit 216 to activate the appropriate memory column being read in response to a memory read request received on the read request input 213.

In FIG. 2, for simplicity, only one row and two columns of memory cells are shown in the memory cell array 214 including memory cells 225 and 226. It is appreciated by those of skill in the art that the memory cell array 214 may include any number of memory cells in a variety of different arrangements. Each memory cell in the memory cell array 214 is coupled to a word line such as the word line 227, and also to a pair of complementary bit lines such as the bit line 228 and bit line# 229 in the case of the memory cell 225. Complementary bit lines are alternately referred to herein as bit line pairs. When a particular memory cell is selected to be read by the word line decoder 218 and column decoder 219 as described above, the complementary bit lines coupled to the selected memory cell are activated to develop a differential signal in a manner well-known to those of ordinary skill in the art.

In one embodiment of the invention, each bit line pair, and thus, each column of memory, is coupled to two sense amplifiers or amps. For example, the bit line 228 and the bit line# 229 coupled to memory cell 225 are each coupled to one input of a first sense amp (SA) 230 and to one input of a second sense amp 232. Each of the first and second sense amps 230 and 232 each further include a sense enable input. A signal received on the sense enable input of each sense amplifier controls when each sense amp is enabled and disabled. The sense enable input of the first sense amp 230 receives a sense enable signal from the first sense enable timing circuit 222, while the sense enable input of the second sense amp 232 receives a sense enable signal from the second sense enable timing circuit 224, such that they may be enabled at different times. In one embodiment, the sense amps are bistable sense amps such that each sense amp includes its own latch. Bistable sense amps are well known to those of skill in the art.

Self-timing circuits such as the first and second sense enable timing circuits 222 and 224 of one embodiment of the invention are well-known to those of ordinary skill in the art. Examples of such timing circuits are discussed in detail in U.S. Pat. No. 4,926,387 which describes a memory timing circuit employing scaled-down models of bit lines using a reduced number of memory cells, and U.S. Pat. No. 5,018,111 describing a timing circuit for memory which employs a reset function. Another example of a timing circuit is taught in U.S. Pat. No. 5,031,141 which describes an apparatus for generating self-timing for an on-chip cache memory.

The first sense amp 230 has an output 234 coupled to the data bus 212 and also to an input of a comparator 238. The output 236 of the second sense amp 232 is also coupled to the data bus 212 and to an input of the comparator 238, which may be the same input as the input to which the output 234 of the first sense amp is coupled. The first and second sense amps operate to sense a data value stored in a memory cell being read in response to a sense enable signal generated after receiving a memory read request. The data value sensed by a particular sense amp is determined by the differential signal on the bit lines corresponding to the particular memory cell being read at the time the sense amp is enabled. The manner in which the first and second sense amps of each memory column operate in cooperation with the comparator 238 and the first and second sense amp enable timing circuits 222 and 224 is described in more detail below.

The arrangement of the sense amps of the invention is discussed in reference to a first sense amp 230 and a second sense amp 232 coupled to the memory column including the memory cell 225. However, it will be understood that other sense amps are coupled to the memory array 214 in a similar manner. It will also be appreciated that, in alternate embodiments, the memory cells of a memory cell array may be arranged in a different manner, and thus, the manner in which the sense amps of the invention are coupled to and distributed across the memory array may be different than the arrangement illustrated and described in reference to FIG. 2. Further, alternate embodiments may include a different number of sense amps per column of memory cells, or a device other than a sense amp which performs a similar function may be used in place of the sense amps to determine the value stored in a particular memory cell being read.

Efficient Reading from a Memory Cell in Accordance with One Embodiment

As discussed above, once a memory read signal is received by the memory read access control circuit 216 of the invention and decoded to access the requested memory cell or cells, the appropriate bit lines are activated to generate an indicator signal. This indicator signal is referred to as a differential indicator signal where differential sensing is used. The characteristics of the indicator signal generated depend on the value stored in the corresponding memory cell requested to be read in a manner well-known to those of ordinary skill in the art.

Figure 3:
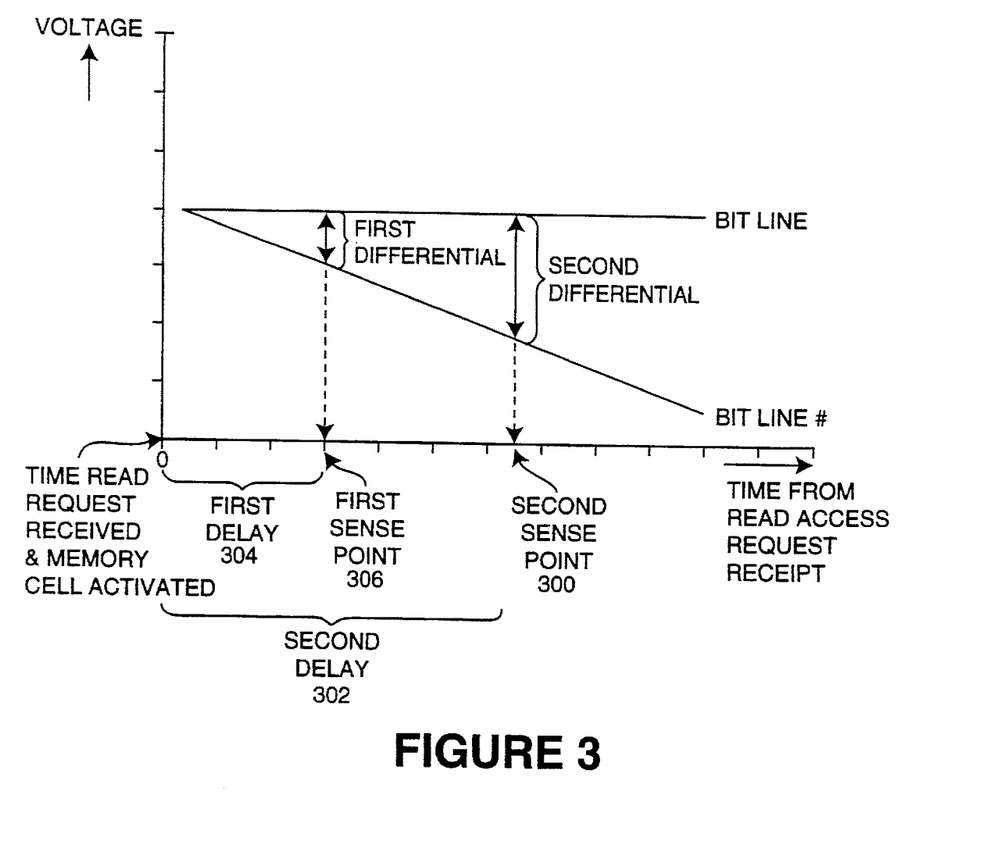
FIG. 3 is a voltage vs. time diagram illustrating the double-sensing operation of one embodiment of the invention.

A typical differential indicator signal is illustrated in a time vs. voltage diagram in FIG. 3. As shown, the differential indicator signal of FIG. 3 is formed from the signal on the bit line and the signal on the bit line# corresponding to the memory cell being read. Time 0 in FIG. 3 corresponds to the time the appropriate bit lines are activated following receipt of a read access request by memory read access control circuitry. In one embodiment, time 0 in FIG. 3 is the time of the clock rising edge on which the memory read access request is received. Sense amps require a minimum differential voltage between the bit line signals in order to reliably decode the differential indicator signal to determine an indicated value. With advances in technology, the minimum differential voltage may be as low as 100–200 mV for some sense amps.

As shown, the voltage differential between the bit line signal and the bit line# signal forming the indicator signal increases over time from the time the bit lines are activated. If a sense amp sensing the indicator signal is enabled before the required differential voltage has developed between the bit line and the bit line#, the results of sensing and decoding the signal may be unreliable and produce an incorrect indicated data value.

In some cases, the time required to develop the minimum differential voltage for accurate sensing can be pushed out even further by voltage drop, alpha particle or other detrimental effects on the indicator signal. Currently available memories compensate for such effects by delaying enablement of the sense amp for a read access until worst case effects on development of the indicator signal have been accounted for. The same delay is imposed before producing a sense enable signal even in cases where this push-out effect is not experienced. In this way, overall memory read performance is compromised in existing memories.

In contrast, one embodiment of the invention utilizes double-sensing to improve overall memory read access performance. The differential indicator signal is sensed twice: once at a first sensing point after a first delay from receipt of the read access signal, and again at a second sensing point after a second, longer delay from receipt of the read access signal without having to reaccess the memory cell.

Referring back to FIG. 2, the double-sensing operation of one embodiment of the invention is described in terms of a specific example. A memory read access request is received on the read access input 213 and the address bus 210 by the memory read access control circuit 216. Receipt of the memory read access request activates self-timing circuits (not shown) within the first sense enable timing circuit 222 and the second sense enable timing circuit 224 to produce the first and second delays prior to generating the first and second sense enable signals respectively.

Also in response to the memory read access request, the word line decoder 218 and the column decoder 219 activate the required word line and bit line pair corresponding to the memory cell requested to be read. For purposes of illustration, if the memory read access request indicates that memory cell 225 is to be read, the word line 227, the bit line 228 and the bit line# 229 are activated. In response to being activated, the bit line pair generates a differential indicator similar to the differential indicator signal shown in FIG. 3.

The operation of the invention is further described with continuing reference to FIG. 2 for particular components of the invention and FIG. 3 for timing references. Reference numbers from 200–238 refer to elements shown in FIG. 2 and reference numbers from 300–306 refer to elements illustrated in FIG. 3. While this example is discussed in the context of a memory read access request identifying a single memory cell to be read, it will be appreciated that the invention applies equally to memory read accesses to multiple memory cells such as in a burst mode access or page access, for example.

Assuming the memory read access request of this example was received at time 0 (FIG. 3), after a first delay 304, the first sense amp enable timing circuit 222 produces a valid first sense amp enable signal to enable the first sense amp 230 at a first sense point 306. Enabling the first sense amp 230 with the first sense enable timing circuit 222 causes the first sense amp 230 to sense the differential indicator signal and decode the detected signal into a first indicated data value. The first indicated data value is based on the characteristics of the differential indicator signal at the first sense point. The first indicated data value resulting from the first sensing operation is driven onto the data bus 212 for processing in response to the read access request as soon as the data value is available. In parallel, the first indicated data value is communicated to the comparator 238 on the first sense amp enable output 234.

After a second delay 302 from receipt of the read access request, the second sense enable timing circuit 224 generates a valid second sense enable signal enabling the second sense amp 232 at a second sense point 300. Enabling the second sense amp 232 with the second sense enable timing circuit 224 causes the second sense amp 232 to sense the differential indicator signal and decode the detected signal into a second indicated data value which is output on the second sense amp output 236. The second indicated data value is based on the characteristics of the differential indicator signal at the second sense point 300.

In parallel to the first indicated data value being driven onto the data bus 212, the first and second indicated data values resulting from the two successive sensing operations are compared by the comparator 238. If the first and second indicated data values are the same, the second indicated data value is discarded and processing continues with the first indicated data value from the first sensing operation. If the two indicated data values are different, the second indicated data value is presumed to be the correct data value because of the longer delay imposed before enabling the second sensing operation. In this case, a signal on the output of the comparator 238 directs the processor 200 to stop processing activities in the current clock cycle and invalidate the first indicated data value. The second indicated data value is driven onto the data bus 212 for subsequent processing in response to the read request. The second indicated data value is available in the next clock cycle in one embodiment causing only a minor performance impact if the first indicated data value is determined to be invalid.

In this manner, the invention provides improved overall memory read access performance by eliminating unnecessary delays experienced by particular memory read operations. Even if the sensing operation is performed and the first sense point and the sensed data is subsequently determined to be incorrect, the indicated data from the second sense point is available thereafter, and the first indicated data value is simply invalidated. In this manner, data integrity is maintained.

Invalidation of the first or second indicated data value in accordance with the above approach may be accomplished in any number of ways. In one embodiment, register renaming is used. Once the indicated data value in a particular register is determined to be invalid, another register with the correct data value is reassigned as that register for further processing. Any number of other approaches to invalidating data are also within the scope of the invention.

Determination of the First and Second Delays in One Embodiment

The first and second delays and thus, the timing of the first and second sense points following receipt of the read access request by the memory read circuit are determined by several factors and will vary depending on the particular memory implementation and the sensitivity of the sense amps or other sensing devices used. In one embodiment, the second delay, and thus, the second sense point is determined such that worst case effects on the differential indicator signal are accounted for. This is similar to the approach used to determine the timing of a single sense enable signal in prior art memories. Using this approach, the second delay ensures that the required minimum differential between the voltage on the bit line and the voltage on the bit line# will have developed even in the presence of worst case effects on the signal. In this manner, sensing and decoding of the indicated data value is reliable.

In contrast, in one embodiment, the first delay and thus, the timing of the first sense point following receipt of the read request by the memory read circuit is determined by considering the time required for the differential indicator signal to develop the required minimum voltage differential in best case conditions. In other words, the first delay is determined such that enough time is provided for the required minimum voltage differential to develop on the bit line pair before sensing in a case where there are minimal or no detrimental effects on the signal.

In another embodiment, the first sense point is selected by the designer to strike a desired balance between improved memory read access time on the one hand, and probability of a correct memory read access at the first sensing point on the other hand. In other words, a shorter delay between the memory read access request and the first sense point contributes to an overall improvement in memory read access performance. However, the shorter the delay, and thus, the further the first sense point is from the second sense point, the higher the probability that the data sensed at the first and second sense points will be different. With this in mind, the memory designer can select the first sense point to achieve the desired or required balance between these competing factors. In one embodiment of the invention using this approach, the cycle time is 6 ns, the first delay is about 2.1 ns from the rising edge of the clock on which the memory read access request is received and the second delay is about 2.6 ns from the same clock rising edge.

In another embodiment, the determination of the first delay is made based on the average delay required to ensure the minimum voltage differential to reliably sense an indicated data value. Other approaches to determining the first and second delays are also within the scope of the invention.

The potential performance advantage which the double-sensing method and apparatus of one embodiment of the invention can provide is described in reference to the timing diagram of FIG. 3. The differential indicator signal shown in FIG. 3 is an example of a signal which is not affected by voltage drop, alpha particle or other effects. Thus, in this example, the differential indicator signal has developed the required minimum voltage differential between the signals on the bit line and the bit line# by the end of the first delay 304 as shown. In this manner, a data value indicated by the signal can be reliably detected at the first sense point 306.

Currently available memories, however delay sensing of the indicator signal until the second sense point 300 in order to compensate for worst case effects which might reduce the differential voltage on the signal at the first sensing point 306. However, in this case, these effects are not present. In other words, by waiting to sense the differential indicator signal until the second sense point 300 in order to compensate for other cases which experience detrimental parasitic effects, the read access time for this particular read request is unnecessarily lengthened and read access performance is reduced.

In contrast, as discussed, the invention senses the indicator signal at the first point and begins processing using the indicated data value sensed at the first point as soon as the first indicated data value is available. In this case, read access performance is improved by as much as the time difference between the first and second sensing point for this particular read access. In this manner, the double-sensing method and apparatus of the invention can provide a significant overall memory read access performance improvement. This is especially true for implementations requiring frequent memory read accesses, and where the memory operations are in the critical path and thus have an impact on cycle time.

In one embodiment, the double-sensing method and apparatus are used for all memory read operations. In another embodiment, the double-sensing method and apparatus are used only for memory read operations which are generally in the critical path. Other memory read operations in this embodiment are performed with only a single sensing operation performed at the second sense point after all detrimental signal effects have been accounted for.

In another embodiment, the memory read access instruction itself may indicate whether the double-sensing method and apparatus of the invention should be utilized or not. As in the embodiment described above, if the instruction indicates that the optimization should be employed, the memory read access operation is performed using the double-sensing method and apparatus of the invention. If the memory read access instruction indicates that the optimization is not to be used, then the value in the memory cell being read is sensed only at the second sense point.

Application of the Invention in a Set Associative Cache Memory

Figure 4:
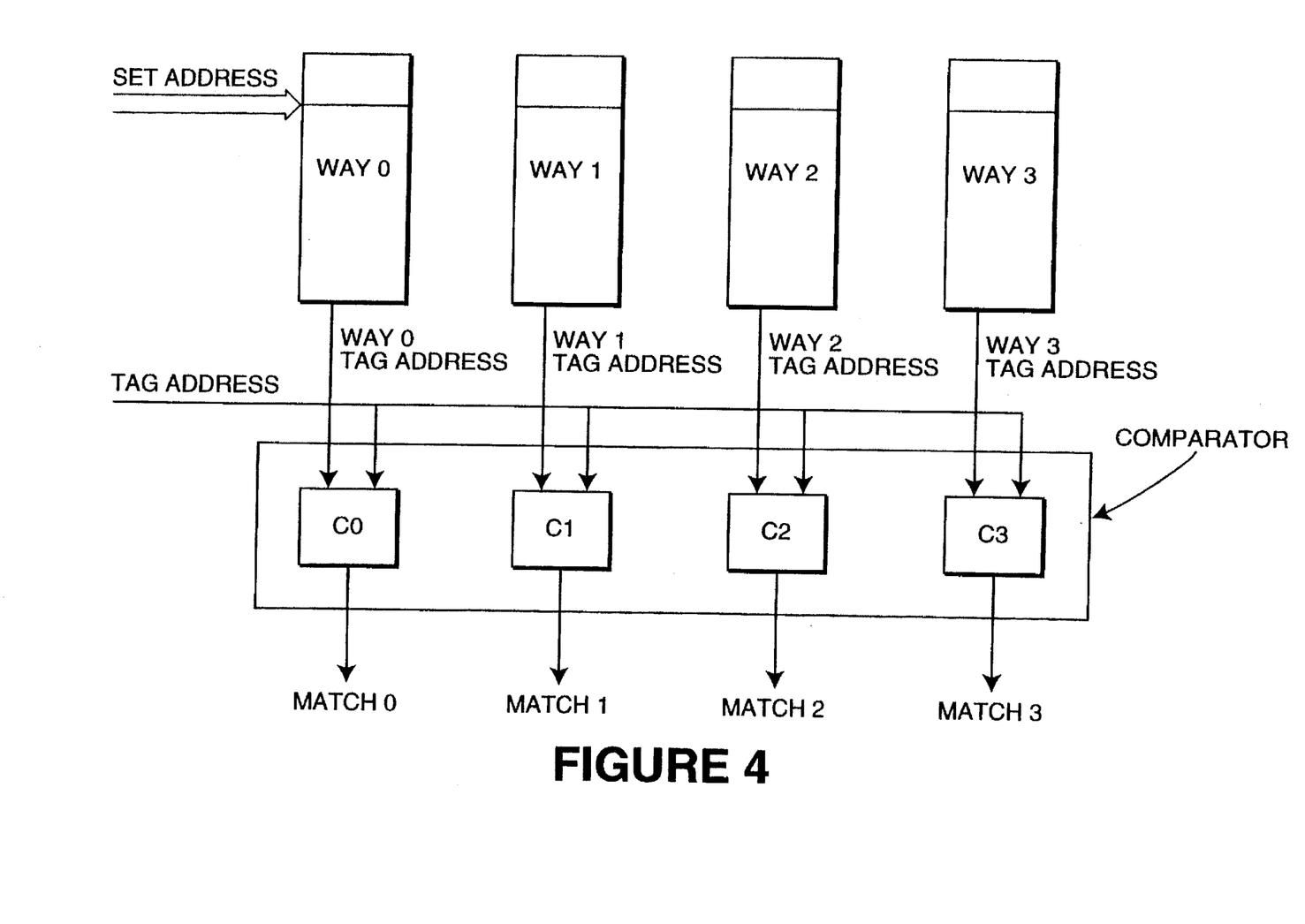
FIG. 4 illustrates a tag RAM in which one embodiment of the invention may be advantageously utilized.

An example of an application in which the double-sensing method and apparatus of the invention may be advantageously utilized is illustrated and described in reference to FIG. 4. FIG. 4 illustrates a four-way set-associative cache directory or cache tag random access memory (RAM). Application of the invention in this context can provide a significant performance advantage. The operation of the cache tag RAM is in the critical path of processing and thus, is a factor in determining cycle time. The general operation of a set-associative cache tag RAM is well-known to those of skill in the art, thus, only the details of the cache tag RAM operation which are helpful in providing a clear description of the application of the invention in this context are provided.

During a cache memory read operation, information read from any of the four ways of the set-associative cache memory in response to the set address is compared to the tag address. If data from a particular way of the memory and the tag address are the same, a match signal or cache "hit" is activated as is well-known. Utilizing the double-sensing memory read optimization of the invention in the cache tag RAM of FIG. 4, if information read from the matched way at the first sense point and second sense point are equal, this way is matched even if there are differences between data read from the other ways at the first and second sense points. This is true because only one of the four ways can be matched for any set address. Alternatively, if the information read from the matched way is not equal at the first and second sense points, this way should not be matched and a cache miss will be indicated.

In this manner, the performance of cache directory read operations can be significantly improved without compromising data integrity. It will be appreciated by those of skill in the art that a different cache tag RAM organization other than a four-way set-associate cache tag RAM will also benefit from the invention. Further, other types of memory read operations other than memory read operations in a cache directory may also operate in accordance with the invention.

The Method of One Embodiment of the Invention

Figure 5:
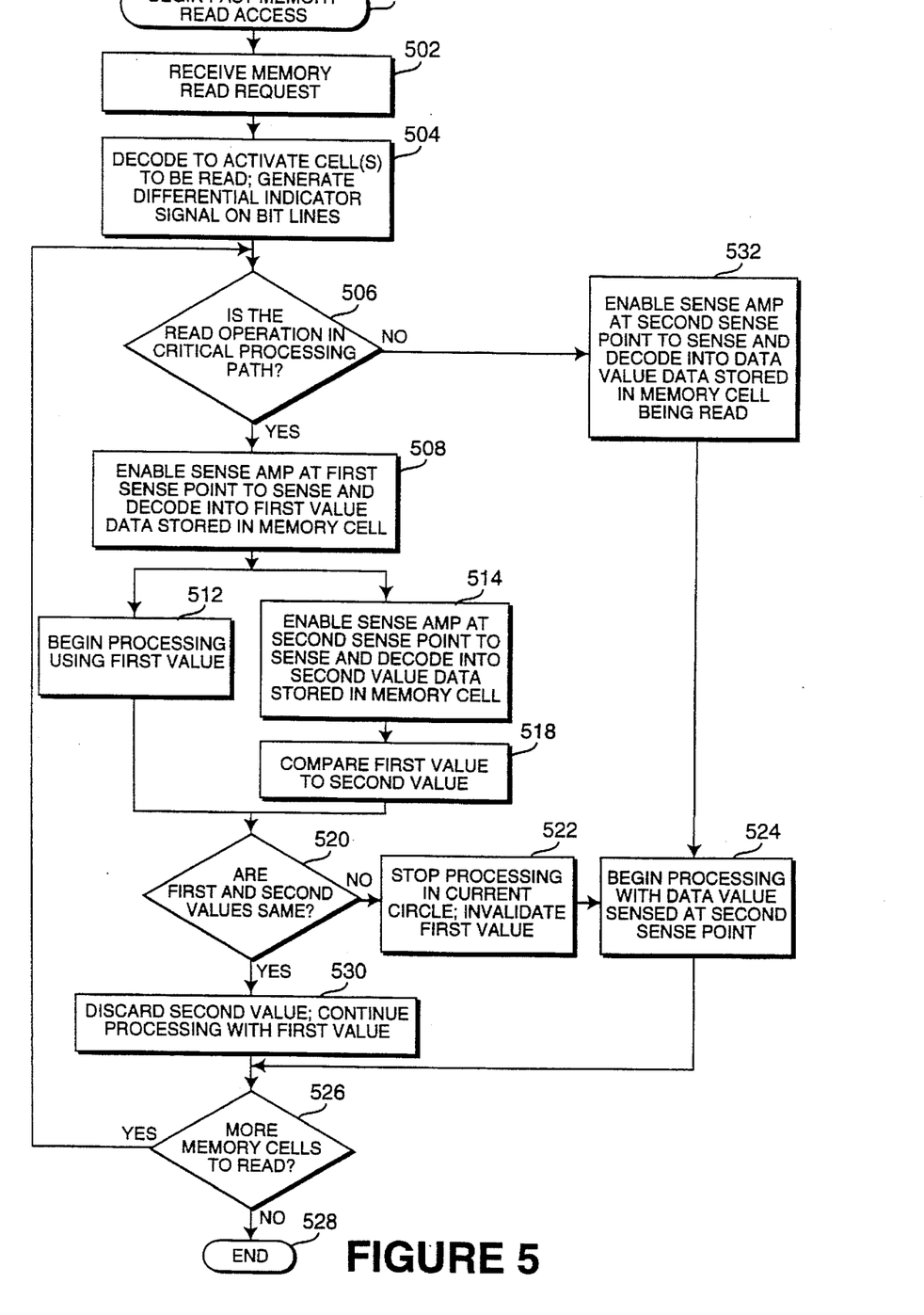
FIG. 5 is a flow diagram illustrating the method of one embodiment of the invention.

Referring now to FIG. 5, the method of one embodiment of the invention is described in more detail. The method of the invention begins at step 500. The memory read circuit of the invention receives a memory read request at step 502. In step 504, the memory cell to be read as indicated by the memory read request is activated such that a differential indicator signal is generated on the corresponding complementary bit lines.

In one embodiment, the method of the invention includes a step 506 of determining whether the specific read operation being processed is in the critical path of continued processing. In this embodiment, if the read operation is determined to be in the critical processing path, then in step 508, a first sense amp coupled to the complementary bit lines corresponding to the memory cell being read is enabled by a first sense enable timing circuit at a first sense point. The first sense amp senses and decodes the signal into a first indicated value. In embodiments not including step 506, the method of the invention proceeds directly from step 504 to step 508.

The first indicated value is driven onto the data bus in step 512 to respond to the read request. Processing using the first indicated value then begins. In parallel, at step 514, a second sense enable timing circuit generates a second sense enable signal to enable a second sense amp. In response, the second sense amp corresponding to the memory cell being read is enabled to sense the differential indicator signal on the complementary bit lines a second time and decode the sensed signal into a second indicated value. In step 518, the first indicated value is compared to the second indicated value to determine in decision block 520 whether the first and second indicated values are the same.

If the first and second indicated values are not the same, then in step 522, processing in the current cycle is stopped and the first indicated value sensed at the first sense point is invalidated. In step 524, processing continues with the second indicated data value sensed at the second sense point. At decision block 526, if there are more data cells to be read, the method of the invention returns to step 504 for continued processing. If this is the last memory cell requested to be read, the method of the invention ends at step 528.

Referring back to decision block 520, if the first and second indicated data values are the same, then in step 530, processing continues with the first indicated data value, and the second indicated data value is discarded. At decision block 526, if there is more data to be read, the method of the invention returns to step 504. If there is no more data to be read, the method of the invention ends at step 528.

Referring back to decision block 506 of one embodiment, where the optimization of the invention may be selectively enabled, if the read operation is not in the critical path, in step 532, only the second sense amp is enabled at the second sense point. The second sense amp senses and decodes into an indicated data value the differential indicator signal on the complementary bit lines. In step 524, processing continues with the indicated data value. Again, in step 526, if there is more data to be read, the method of the invention returns to step 504 and if not, the method ends at step 528.

Thus, the invention provides a method and apparatus for improving memory read access performance using double-sensing. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

What is claimed is:

1. An apparatus for reading a value stored in a memory cell in a computer system, the apparatus comprising:

a first sense amplifier coupled to the memory cell, the first sense amplifier having an input coupled to receive a first sense enable signal at a first sense time, and an output coupled to provide to a data bus a first indicated data value responsive to the first sense enable signal, the data bus being coupled to a processor such that the first indicated value is provided to the processor at the first sense time;

a second sense amplifier coupled to the memory cell, the second sense amplifier having an input coupled to receive a second sense enable signal at a second, later sense time, and an output coupled to provide a second indicated data value responsive to the second sense enable signal; and a comparator coupled to the first and second sense amplifiers, the comparator issuing a signal to invalidate the first indicated data value and providing the second indicated data value to the processor if the first and second indicated data values are different.

2. The apparatus as set forth in claim 1 wherein the memory is a cache memory cell.

3. The apparatus as set forth in claim 1 wherein the memory is a flash memory cell.

4. The apparatus as set forth in claim 1 wherein the first and second sense amplifiers are bistable sense amplifiers.

5. A computer system comprising:

a bus to communicate information a processor coupled to the bus to process information; and a cache memory coupled to the processor to store information, the cache memory including:
an array of memory cells including a first memory cell to be read,
a first sense amplifier coupled to the first memory cell and having an output coupled to an input of the processor, the first sense amplifier providing a first indicated data value to the processor at a first sense time,
a second sense amplifier coupled to the first memory cell, the second sense amplifier providing a second indicated data value on an output at a second, later sense time, and
a comparator having inputs coupled to the first and second sense amplifier and an output coupled to the processor, the comparator invalidating the first indicated data value provided to the processor and providing the second indicated data value to the processor if the first and second data values are different.

6. The computer system as set forth in claim 5 wherein the cache memory is a set associative cache memory.

7. The computer system as set forth in claim 6 wherein the comparator further indicates that a way of the set associative cache memory is not matched if the first and second data values are different.

8. The computer system as set forth in claim 5 wherein the first and second sense amplifiers are bistable sense amplifiers.

9. The computer system as set forth in claim 5 wherein the cache memory is a cache tag memory.

10. In a computer system, a method for reading data from a memory cell comprising the steps of:

accessing the memory cell for reading in response to a read request from a processor;

sensing a value stored in the cell at a first time;

communicating the value sensed at the first time to the processor;

sensing the value stored in the cell at a second, later time;

comparing the value sensed at the first time to the value sensed at the second, later time; and if the valued sensed at the first time and the value sensed at the second, later time are different, performing the steps of:
sending a signal to the processor to invalidate the value sensed at the first time, and
communicating the value sensed at the second time to the processor.

* * * * *

UNITED STATES PATENT AND TRADEMARK OFFICE
CERTIFICATE OF CORRECTION

PATENT NO. : 5,668,766
DATED : September 16, 1997
INVENTOR(S) : Arkady Bramnik It is certified that error appears in the above-identified patent and that said Letters Patent is hereby corrected as shown below:

In column 4 at line 13 delete "army" and insert --array--

Signed and Sealed this

Sixth Day of January, 1998

BRUCE LEHMAN

*Attest:*

*Attesting Officer*   Commissioner of Patents and Trademarks